Sept. 2, 1958

W. E. INGHAM 2,850,646

TRANSISTER BISTABLE CIRCUIT

Filed May 20, 1954

2 Sheets-Sheet 1

INVENTOR
W. E. INGHAM
BY Glascock Downing & Seebold
ATTORNEYS.

Sept. 2, 1958 W. E. INGHAM 2,850,646

TRANSISTER BISTABLE CIRCUIT

Filed May 20, 1954 2 Sheets-Sheet 2

INVENTOR
W. E. INGHAM
BY
ATTORNEYS

United States Patent Office 2,850,646

Patented Sept. 2, 1958

2,850,646

TRANSISTOR BISTABLE CIRCUIT

William Ellis Ingham, Ealing, London, England, assignor to Electric & Musical Industries Limited, Hayes, Middlesex, England, a company of Great Britain Application May 20, 1954, Serial No. 431,222

Claims priority, application Great Britain May 29, 1953

8 Claims. (Cl. 307—88.5)

This invention relates to two-state electrical circuits.

In electronic digital computers and other circuits of a similar nature means are often required for counting a succession of pulses and registering the count on the scale two. Circuits comprising a series of thermionic valve two-state circuits are well known for this purpose. Such circuits have, however, the disadvantages of dissipating considerable power and of requiring considerable space, since the number of two-state circuits in the series tends to be large. To reduce these disadvantages two-state circuits employing transistors of the point contact type instead of thermionic valves have been proposed. However, such proposed circuits have other disadvantages, being for instance relatively complex or having limited operating rates which render them unsuitable in some applications.

An object of the present invention is to provide an improved two-state electrical circuit employing a transistor and which is of simple construction and can yet operate at a relatively rapid rate.

Another object of the present invention is to provide a two-state circuit comprising a transistor of the point contact type and means for applying trigger pulses to the transistor to switch the transistor alternately to a high conductivity state and to a low conductivity state.

Another object of the present invention is to provide a two-state circuit comprising a transistor of the point contact type, a single source of trigger pulse, an individual coupling from said source to two electrodes of the transistor, preferably the emitter and the base electrodes, such that the transistor can be switched alternately from one conductivity state to another by the application of successive trigger pulses of the same polarity. Preferably a direct current coupling is provided from said source to the emitter electrode.

By using a direct current coupling to the emitter the impedance of the source of trigger pulses is included directly in the emitter circuit so that a high degree of coupling is obtained. This facilitates rapid switching of the transistor to its low conductivity state, which requires a large current pulse, and consequently enables higher operating speeds to be attained than could be attained with other forms of coupling to the emitter. In the preferred form of circuit the switching of the transistor to its high conductivity state is achieved by application of the negative pulses to the base. Moreover the coupling from the source of trigger pulses to the base may be either a direct current coupling or an alternating current coupling, since a smaller pulse is adequate for switching to the high conductivity state than that required for switching to the low conductivity state.

Figure 1:
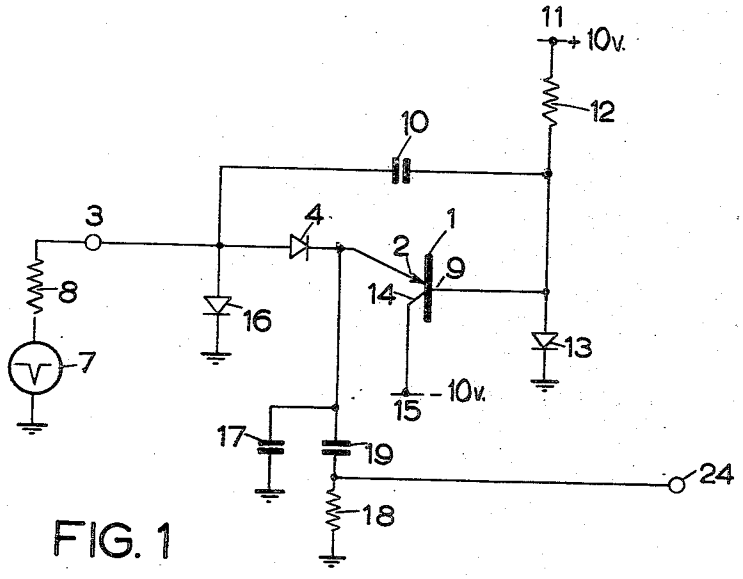
Figure 2:
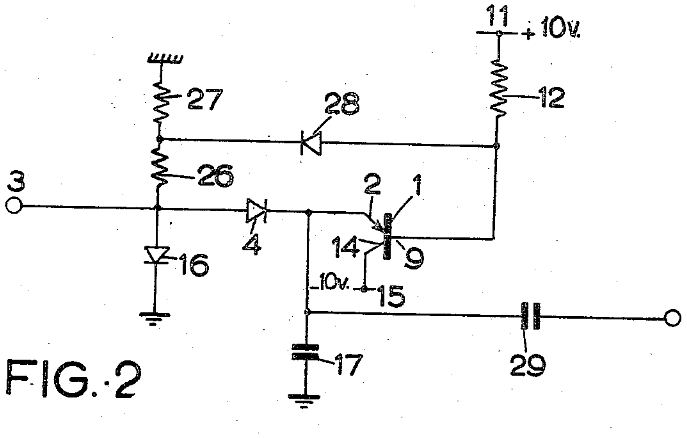
Figure 3:
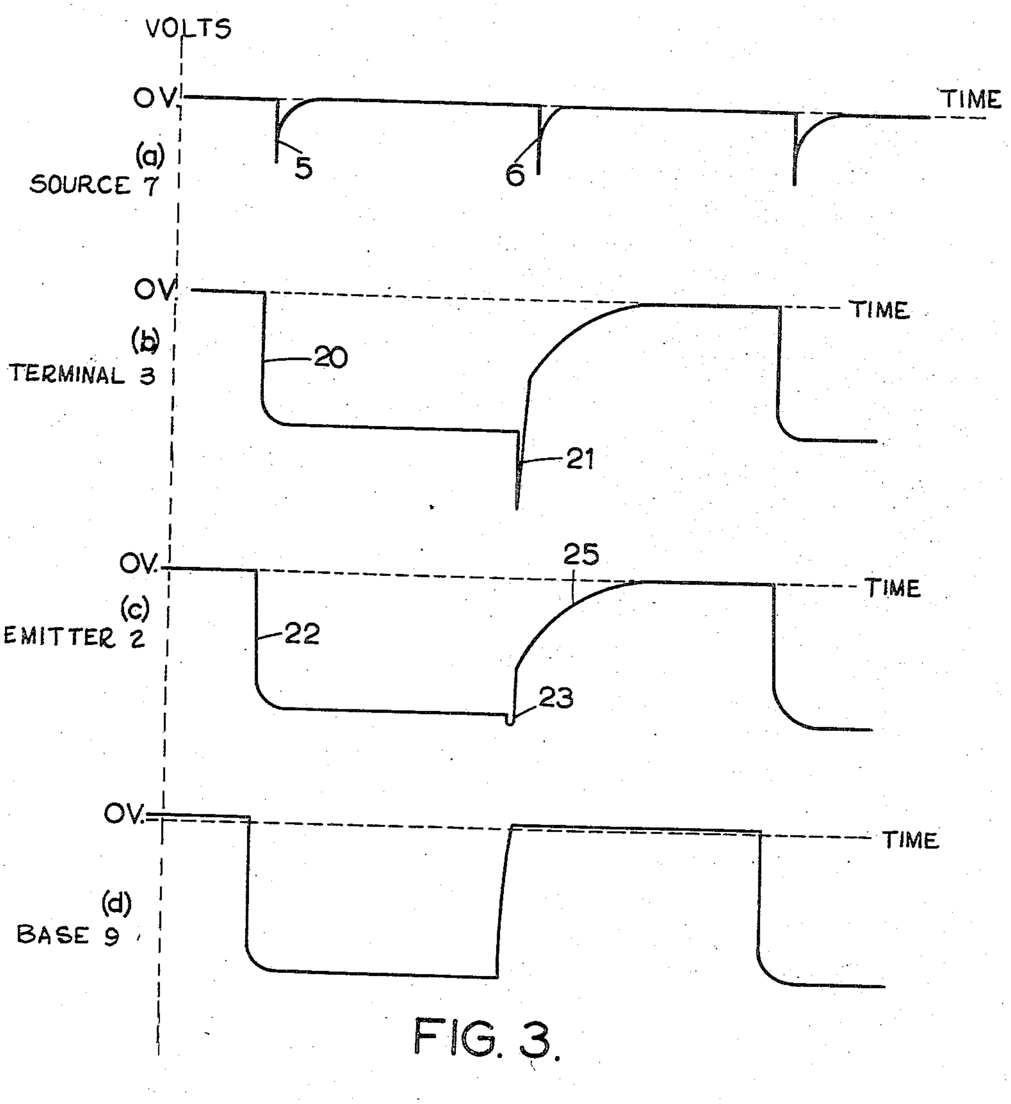

In order that the invention may be clearly understood and readiy carried into effect, the invention will be described with reference to the accompanying drawings, in which:

Figure 1 illustrates one form of two-state circuit in accordance with the present invention, Figure 2 illustrates a modification of Figure 1, and Figure 3 comprises waveform diagrams explanatory of the operation of Figures 1 and 2.

The circuit illustrated in Figure 1 comprises a transistor 1 of the point contact type which has its emitter 2 connected to a terminal 3 via a non-linear impedance in the form of a rectifier 4. The terminal 3 is fed with negative triggering pulses such as shown in Figure 3(*a*), two of the pulses being denoted by the references 5 and 6 in Figure 3(*a*). The pulse source is shown conventionally in the drawing and denoted by the reference 7 and the impedance of the pulse source is represented by the resistor 8. If, as will be assumed, the circuit is one stage of a binary counter chain, the pulse source 7 is constituted by the output load resistor of a preceding circuit similar to that illustrated. The base 9 of the transistor is connected via a capacitor 10 to the terminal 3 and is thus alternating-current coupled to the same source of trigger pulses as the emitter. Moreover, the base 9 is connected to a positive supply rail 11, maintained at a suitable voltage, which may be for example +10 volts, via load resistor 12 and it is grounded via a rectifier 13. The collector 14 of the transistor is connected directly to the negative supply rail 15 which is maintained at a suitable voltage, which may be for example —10 volts. The terminal 3 is connected to ground through a rectifier 16 which is provided for the purpose of clipping positive pulses which appear at the input terminal 3. The emitter 2 is also grounded via a capacitor 17 and the capacitor is shunted by a differentiating circuit consisting of the series combination of a resistor 18 and a capacitor 19. Resistor 18 constitutes the output load resistor of the circuit.

In describing the operation of the circuit, it will be assumed initially that the transistor is in a stable state of low conductivity, usually termed the "off" state of the transistor. The next trigger pulse to occur, say the pulse 5, is then coupled by the capacitor 10 and the resistor 12 to the base of the transistor, the pulse switching off the rectifier 13 as soon as it carries the base 9 below ground potential. The rectifier 4 is non-conducting since the emitter 2 is at about ground potential in the "off" state of the transistor. When the base 9 is carried below ground potential, the emitter potential is momentarily maintained by the capacitor 17 so that it does not immediately follow that of the base. Therefore the base potential is taken below that of the emitter and the transistor is tuned on to a state of relatively high conductivity, the voltage drop across the resistor 12 maintaining the base potential at a negative value after the triggering pulse 5 ceases. The capacitor 17 charges through the transistor and initially establishes a high emitter current, and as the capacitor 17 charges the emitter potential follows that of the base and the rectifier 4 is rendered conducting. In consequence the transistor is carried into the bottom region of its characteristic. In this state, the transistor is stable and the state is maintained until the next trigger pulse occurs, namely the pulse 6. When the pulse 6 occurs the terminal 3 is taken to a negative potential with respect to the emitter. Momentarily the rectifier 4 is switched off, that is changed to a high impedance state, and the resultant change in the emitter load makes the transistor unstable in its high conductivity state, and causes the emitter potential to fall. The capacitive coupling from the pulse source 7 to the base 9 of the transistor via the capacitor 10 does not counteract this action since in the "on" state of the transistor, the base impedance is low compared with that of the capacitor 10, so that the pulse 6 is substantially attenuated at the base 9. The coupling from the terminal 3 to the base 9 via the capacitor 10 is thus ineffective in the conducting state of the transistor. When the emitter potential falls, the transistor then relaxes to the off state so that eventually the emitter potential returns to about ground potential. The transistor remains in its off state until the next trigger pulse occurs.

Figure 3(*b*) shows the potential waveform appearing at the terminal 3 and Figure 3(*c*) shows the waveform at the emitter. The base potential waveform is indicated in Figure 3(*d*). The portion 20 of the waveform (*b*) represents the transition of the rectifier 4 from its high impedance state to its low impedance state when the transistor changes to its state of high conductivity. The spike 21 is produced by the trigger pulse 6 and is instrumental in switching the rectifier 4 to its high impedance state. The corresponding portions in the emitter potential waveform (*c*) are represented by the references 22 and 23 respectively. When the waveform (*c*) is differentiated by the capacitor 19 and resistor 18 the portions 22 produce negative pulses similar to Figure 3(*a*) and these pulses can be derived from the output terminal 24 and used to trigger another similar two-state circuit. The circuit shown in Figure 1 can therefore be employed as one stage of a binary counter chain. The portions 23 in the waveform (*c*) (corresponding to the spikes 21 in the waveform (*b*)) are of small amplitude and are not effective to produce negative pulses. The rise in the emitter potential corresponding to the transistor being turned off is represented by the portion 25 of the waveform (*c*) and the positive potential excursion which tends to be produced across the resistor 18 by the differentiation of the portion 25 of the waveform (*c*) are attenuated by the rectifier corresponding to 16 in the next stage of the binary counter chain. It will be appreciated that when the circuit shown is used as one stage of a binary counter chain the resistor 18 is made to have the value which is required for the input resistance of the succeeding stage since the resistor 18 acts as the source of triggering pulses whose resistance constitutes the emitter resistance for the following stage.

In the circuit shown the negative trigger pulses from the source 7 are direct current coupled to the emitter 2 and alternating current coupled to the base 9 and this arrangement has the advantage that it enables a relatively high operating frequency to be attained, compared with that obtainable with other forms of coupling to the emitter.

In a modification of the invention shown in Figure 2 the output resistor 18 is replaced by two resistors 26 and 27 which are connected from the terminal 3 to ground. Resistor 27 is of lower value than resistor 26. The coupling from the terminal 3 to the base of the transistor is a direct current coupling through a rectifier 28 which, as shown, is connected from the base 9 to the junction of the resistors 26 and 27. The output from the circuit is derived from the emitter via capacitor 29 which co-operates with the resistors similar to 26 and 27 of the next circuit to differentiate the emitter potential waveform.

The operation of Figure 2 is similar to that of Figure 1 and the resulting waveforms are similar to those of Figure 3. When the transistor is off, the base potential is fixed by conduction of the rectifier 28, the rectifier current passing mainly through resistor 27 to ground. When the potential at the terminal 3 goes negative on the occurrence of a trigger pulse, the transistor base is pulled negative in potential with respect to the emitter, the potential of which is momentarily maintained by capacitor 17. The transistor is therefore switched on an dcondenser 29 produces a negative trigger pulse across the resistors 26 and 27 of the following circuit. When the trigger pulse ceases, the voltage drop across the base resistor 12 maintains the negative voltage at the base 9. The rectifier 28 is switched off and the negative voltage at the base 9 is sufficient to prevent the next trigger pulse from switching on the rectifier 28. Therefore the next negative trigger pulse to occur at the terminal 3 cuts off the rectifier 4 and switches off the transistor, the negative pulse produced across 27 being unable to affect the base since the element 28 is switched off, rendering the coupling from the terminal 3 to the base ineffective in the conducting state of the transistor. In the potential waveform produced at the base in the circuit of Figure 2 the rise in potential produced when the transistor is switched off is more rapid (over most of the range) than in the case of Figure 1 since in the latter circuit the capacitor 10 has to be charged through the resistor 12 as the base potential rises. In Figure 2 the rectifier 28 is cut-off until the base potential rises above that of the junction of 26 and 27.

In the waveform diagrams shown in Figure 3 the positive potential excursions occurring at the transistor electrodes are, for purposes of explanation, shown to be steeper than would actually occur in practice, negative potential excursions of an electrode in general being much faster than positive ones for the same electrode.

The circuits described are of course not limited in their application to binary counters. For instance they can also be used as staticisers and where the object is not binary counting but merely frequency division.

What I claim is:

1. A two-state circuit comprising a transistor having a base electrode, an emitter electrode and a collector electrode, a source of trigger pulses, individual couplings from said source to two of said electrodes which tend to produce opposite changes in the conductivity state of said transistor in response to a trigger pulse, one of said couplings including means responsive to the conductivity state of said transistor for rendering said coupling effective in one conductivity state and ineffective in another conductivity state, and the other coupling including delay means for delaying the effect of trigger pulses applied by the respective coupling relative to the effect of trigger pulses applied by the other coupling, whereby said transistor can be switched alternately between said conductivity states in response to successive trigger pulses from said sources.

2. A two-state circuit comprising a transistor having a base electrode, an emitter electrode and a collector electrode, a source of trigger pulses, a unilaterally conductive device connected in a path from said source to said emitter electrode, a conductive impedance connected to said base electrode whereby a polarising voltage can be applied to said base electrode, a coupling from said source to said base electrode including means responsive to the conductivity state of said transistor for rendering said coupling effective in one stable conductivity state of said transistor and ineffective in another stable conductivity state of said transistor, and means connected to said path for delaying the effect of trigger pulses applied via said path relative to the effect of trigger pulses applied via said coupling, whereby said transistor can be switched alternately between said conductivity states in response to successive trigger pulses from said sources.

3. A two-state circuit comprising a transistor having a base electrode, an emitter electrode and a collector electrode, a source of trigger pulses, a unilaterally conductive device connected in a direct current path from said source to said emitter electrode, a conductive impedance connected to said base electrode whereby a polarising voltage can be applied to said base electrode, a coupling from said source to said base electrode including means responsive to the conductivity state of said transistor for rendering said coupling effective in one stable conductivity state of said transistor and ineffective in another stable conductivity state of said transistor, and a capacitor connected from a point in said path between the emitter electrode and said device to a point of substantially fixed potential for delaying the effect of said trigger pulses applied via said path relative to the effect of trigger pulses applied via said coupling, whereby said transistor can be switched alternately between said conductivity states in response to successive trigger pulses from said sources.

4. A circuit according to claim 2, said means in the coupling from said source to said base electrode comprising a capacitor.

5. A circuit according to claim 4, comprising a path including an output load resistor for the circuit connected in shunt with said capacitor.

6. A circuit according to claim 2, said means in the coupling from said source to said base electrode comprising a unilaterally conductive device.

7. A two-state circuit comprising a transistor of the point contact type having an emitter electrode, a base electrode and a collector electrode, a unilaterally conductive device connected in a path from said source to said emitter electrode, a resistor connected to said base electrode whereby a polarising voltage can be applied to said base electrode, a second resistor and a second unilaterally conductive device connected in a path from said source to said base electrode, said second resistor being nearer said source than said second unilaterally conductive device, a third resistor connected from a point of said latter path between said second resistor and said unilaterally conductive device to a point of substantially fixed potential, a capacitor connected from a point in said first path between the emitter electrode and said first unilaterally conductive device to a point of substantially fixed potential, and means for deriving output signals from said emitter electrode.

8. A circuit according to claim 7 wherein said source of trigger pulses is arranged to deliver pulses of negative polarity, and said unilaterally conductive device is conductive from said source to said emitter electrode and said second unilaterally conductive device is conductive from said base electrode to said source.

References Cited in the file of this patent

UNITED STATES PATENTS

| | | |
|---|---|---|
| 2,629,834 | Trent | Feb. 24, 1953 |
| 2,644,896 | Lo | July 7, 1953 |
| 2,724,061 | Emery | Nov. 15, 1955 |